(12) United States Patent
Sasaki et al.

(10) Patent No.: US 8,981,226 B2
(45) Date of Patent: Mar. 17, 2015

(54) ELECTRICALLY CONDUCTIVE MICROPARTICLE, ANISOTROPIC ELECTRICALLY CONDUCTIVE MATERIAL, CONNECTION STRUCTURE, AND METHOD FOR PRODUCTION OF ELECTRICALLY CONDUCTIVE MICROPARTICLE

(75) Inventors: Taku Sasaki, Osaka (JP); Hiroshi Natsui, Shiga (JP); Shinya Uenoyama, Shiga (JP); Ren-de Sun, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 441 days.

(21) Appl. No.: 12/734,162

(22) PCT Filed: Oct. 24, 2008

(86) PCT No.: PCT/JP2008/069359
§ 371 (c)(1),
(2), (4) Date: Jun. 15, 2010

(87) PCT Pub. No.: WO2009/054502
PCT Pub. Date: Apr. 30, 2009

(65) Prior Publication Data
US 2010/0294539 A1    Nov. 25, 2010

(30) Foreign Application Priority Data
Oct. 24, 2007   (JP) ................. 2007-276351

(51) Int. Cl.
*H01B 5/14*   (2006.01)
*H01B 1/22*   (2006.01)
(Continued)

(52) U.S. Cl.
CPC ............ *H05K 3/323* (2013.01); *C23C 18/1635* (2013.01); *C23C 18/30* (2013.01); *C23C 18/38* (2013.01); *C23C 18/40* (2013.01);
(Continued)

(58) Field of Classification Search
USPC ........................................... 174/126.4
See application file for complete search history.

(56) References Cited

U.S. PATENT DOCUMENTS 4,468,437 A * 8/1984 Patten et al. ............... 428/553
4,740,657 A * 4/1988 Tsukagoshi et al. ....... 174/88 R
(Continued)

FOREIGN PATENT DOCUMENTS

| EP | 0 967 298 | 12/1999 |
|---|---|---|
| EP | 1 278 211 | 1/2003 |

(Continued)

OTHER PUBLICATIONS

Supplementary European Search Report dated Feb. 25, 2011 in European Application No. EP 08841659.9.
(Continued)

*Primary Examiner* — William H Mayo, III
*Assistant Examiner* — Hiram E Gonzalez
(74) *Attorney, Agent, or Firm* — Wenderoth, Lind & Ponack, L.L.P.

(57) ABSTRACT

The present invention is a conductive particle having a copper layer formed on a surface of a resin particle, wherein in the copper layer, an area ratio of an area corresponding to voids in a cross-section in a thickness direction is 5% or less, and copper composing the copper layer has an average crystallite diameter of 40 nm or more. It is an object of the present invention to provide a conductive particle which has low initial connection resistance and which is hard to increase in connection resistance even when stored for a long period.

5 Claims, 3 Drawing Sheets

(51) Int. Cl.
*B05D 5/12* (2006.01)
*H05K 3/32* (2006.01)
*C23C 18/16* (2006.01)
*C23C 18/30* (2006.01)
*C23C 18/38* (2006.01)
*C23C 18/40* (2006.01)
*C25D 5/56* (2006.01)
*H01R 13/03* (2006.01)
*C23C 18/20* (2006.01)

(52) U.S. Cl.
CPC ............... *C23C 18/405* (2013.01); *C25D 5/56* (2013.01); *H01B 1/22* (2013.01); *H01R 13/035* (2013.01); *C23C 18/2086* (2013.01); *H05K 2201/0221* (2013.01)
USPC .................. 174/126.4; 252/512; 427/123

(56) References Cited

U.S. PATENT DOCUMENTS

| | | | | |
|---|---|---|---|---|
| 5,977,490 | A | * | 11/1999 | Kawakita et al. ............. 174/265 |
| 2003/0066754 | A1 | * | 4/2003 | Seita et al. .................... 205/220 |
| 2005/0260430 | A1 | | 11/2005 | Kuroda et al. |

FOREIGN PATENT DOCUMENTS

| | | |
|---|---|---|
| EP | 1 286 576 | 2/2003 |
| JP | 62-229601 | 10/1987 |
| JP | 4-187781 | 7/1992 |
| JP | 10-106351 | 4/1998 |
| JP | 11-61424 | 3/1999 |
| JP | 2001-093329 | 4/2001 |
| JP | 2003-64480 | 3/2003 |
| JP | 2003-064480 | 3/2003 |
| JP | 2003-068144 | 3/2003 |
| JP | 2005-129424 | 5/2005 |
| JP | 2005-175308 | 6/2005 |
| JP | 2006-128046 | 5/2006 |

OTHER PUBLICATIONS

International Search Report issued Feb. 3, 2009 in International (PCT) Application No. PCT/JP2008/069359.

Office Action issued Apr. 5, 2013 in corresponding European Application No. EP 08 841 659.9.

* cited by examiner

ELECTRICALLY CONDUCTIVE MICROPARTICLE, ANISOTROPIC ELECTRICALLY CONDUCTIVE MATERIAL, CONNECTION STRUCTURE, AND METHOD FOR PRODUCTION OF ELECTRICALLY CONDUCTIVE MICROPARTICLE

This application is a U.S. national stage of International Application No. PCT/JP2008/069359 filed Oct. 24, 2008.

TECHNICAL FIELD

The present invention relates to a conductive particle which has low initial connection resistance and which is hard to increase in connection resistance even when stored for a long period. The present invention further relates to a method of producing the conductive particle.

BACKGROUND ART

Conductive particles are used in the form that they are interposed between electrode terminals of boards or electronic devices in order to electrically connect a board to another board or to electrically connect a small part such as a semiconductor device to a board. Particularly, the conductive particles are widely used in electronic devices in which a distance between wirings is small, such as a liquid crystal display, a personal computer and a mobile telephone.

An anisotropic conductive material contains a conductive particle and an insulative adhesive resin and used as an electrode-connecting material. Examples of the anisotropic conductive material include an anisotropic conductive film, an anisotropic conductive sheet, anisotropic conductive paste, an anisotropic conductive adhesive, and an anisotropic conductive pressure sensitive adhesive.

Conventionally, the conductive particle prepared by forming a gold layer on its surface has been mainly used. The conductive particle prepared by forming a gold layer on its surface has low connection resistance. Moreover, this conductive particle does not increase in connection resistance even when stored for a long period since there is not a possibility of being oxidized in gold.

However, it is tried to further reduce an amount of a current flowing through an integrated circuit for the purpose of suppressing consumed power in response to energy conservation of recent years. Accordingly, the conductive particle having lower connection resistance than that of a conventional conductive particle has been required.

For this situation, Patent Document 1 discloses a conductive particle prepared by forming a copper layer on the surface of an inorganic or organic particle. Since copper is a metal having smaller electric resistance than that of gold, it was expected to obtain a conductive particle having smaller connection resistance than that of a conductive particle having a gold layer.

However, in fact, the conductive particle provided with the copper layer is sometimes not adequately low in connection resistance. Moreover, there was a problem that copper is apt to be oxidized compared with gold and the connection resistance increases gradually if being stored for a long period.

Patent Document 1: Japanese Kokai Publication Hei-11-61424 (JP-A H11-61424)

DISCLOSURE OF THE INVENTION

Problems to be Solved by the Invention

It is an object of the present invention to provide a conductive particle which has low initial connection resistance and which is hard to increase in connection resistance even when stored for a long period. It is further an object of the present invention to provide a method of producing the conductive particle.

Means for Solving the Problems

The present invention provides a conductive particle comprising a copper layer formed on a surface of a resin particle, wherein in the copper layer, an area ratio of an area corresponding to voids in a cross-section in a thickness direction is 5% or less, and copper composing the copper layer has an average crystallite diameter of 40 nm or more.

Hereinafter, the present invention will be described in detail.

When the copper layer is formed on the surface of a resin particle by electroless plating, hydrogen produced by a main reaction or copper particles produced by a side reaction in a plating step are taken in, and therefore voids are generated in the copper layer. Herein, the void refers to a minute cavity existing in the copper layer.

The present inventors found that high connection resistance in the conventional conductive particle provided with the copper layer is caused by the voids in the copper layer. When there are voids in the copper layer, a volume of the copper in the copper layer is decreased. Furthermore, it is conceivable that if the void remains in the copper layer, a number of grain boundaries of the copper increases and therefore the connection resistance increases. Accordingly, when a ratio of the void in the copper layer is limited to a certain value or less, the initial connection resistance of the conductive particle provided with the copper layer can be reduced.

The present inventors also found that by setting the average crystallite diameter of the copper composing the copper layer at a certain value or more, the conductive particle which is hard to increase in connection resistance even when stored for a long period can be attained. The reason why the conductive particle is hard to increase in connection resistance is conceivably that when the average crystallite diameter of the copper is a certain value or more, oxygen to cause the oxidation of the copper is hardly transferred through the grain boundary.

That is, the present inventors found that by setting the ratio of the void in the copper layer to a certain value or less and by setting the average crystallite diameter of the copper composing the copper layer to a certain value or more, it is possible to obtain a conductive particle which has low initial connection resistance and which is hard to increase in connection resistance even when stored for a long period, and has completed the present invention.

The conductive particle of the present invention has a structure in which a copper layer is formed on a surface of a resin particle.

A resin composing the resin particle is not particularly limited, and examples thereof include polyolefins such as polyethylene, polypropylene, polystyrene, polyisobutylene, polybutadiene and the like, acrylic resins such as polymethyl methacrylate, polymethyl acrylate and the like, polyalkylene terephthalate, polysulfone, polycarbonate, polyamide, phenolic resins such as phenol-formaldehyde resin and the like, melamine resins such as melamine-formaldehyde resin and the like, benzoguanamine resins such as benzoguanamine-formaldehyde resin and the like, urea-formaldehyde resins, epoxy resins, saturated polyester resins, unsaturated polyester resins, polyethylene terephthalate, polysulfone, polyphenyleneoxide, polyacetal, polyimide, polyamide-imide, polyether ketone, polyether sulfone, and organic-inorganic hybrid resins such as polyorganosiloxanes having an acrylic skeleton obtained by polymerizing organosiloxane having an acryloyl group. Among these compounds, preferably, a resin obtained by polymerizing one or more of various polymerizable monomers having an ethylenic unsaturated group is used since a resin particle having suitable hardness can be easily obtained.

A preferred lower limit of an average particle diameter of the resin particle is 1 µm and a preferred upper limit thereof is 1000 µm. If the average particle diameter of the resin particle is less than 1 µm, aggregation of the resin particles tends to take place in forming the conductive layer and the conductive particles produced by use of the aggregated resin particles may cause a short circuit between electrodes adjacent to each other. If the average particle diameter of the resin particle is more than 1000 µm, the copper layer is prone to be peeled off and reliability of a conductive connection may be deteriorated. A more preferred lower limit of the average particle diameter of the resin particle is 10 µm and a more preferred upper limit thereof is 750 µm. Here, in the present description, the average particle diameter of the resin particle refers to an average value obtained by measuring diameters of 50 particles selected at random using an optical microscope or an electron microscope. Also, the average particle diameter can be determined by statistically processing the measurement results with a particle diameter measuring apparatus such as a Coulter counter.

A coefficient of variation of the average particle diameter of the resin particles is preferably 10% or less. If the coefficient of variation is more than 10%, it may be impossible to uniformly control a distance between electrodes opposed to each other by using the obtained conductive particles. Here, the coefficient of variation is a numeric value expressed as a percentage (%) of a value obtained by dividing the standard deviation obtained from a particle size distribution by the average particle diameter.

A preferred lower limit of a 10% K value of the resin particle is 1000 MPa and a preferred upper limit thereof is 15000 MPa. If the 10% K value is less than 1000 MPa, since the strength of the resin particle to be obtained is insufficient, the particle may be broken in being compressed and deformed and it may be impossible to perform a function as a conductive particle. If the 10% K value is more than 15000 MPa, the conductive particle may damage an electrode. A more preferred lower limit of the 10% K value is 2000 MPa and a more preferred upper limit thereof is 10000 MPa. Here, the 10% K value can be determined by using a micro compression testing machine (for example, "PCT-200" manufactured by Shimadzu Corp.), measuring a compression displacement (mm) at the time of compressing a particle by an end face of a cylindrical smooth indenter of 50 µm in diameter made of diamond under conditions of a compression rate 2.6 mN/sec and a max testing load 10 g, and deriving a K value from the following equation:

$$K \text{ value } (N/mm^2) = (3/\sqrt{2}) \cdot F \cdot S^{-3/2} \cdot R^{-1/2}$$

F: load (N) in compressing/deforming a particle by 10%
S: compression displacement (mm) in compressing/deforming a particle by 10%
R: radius (mm) of a particle A recovery rate of the resin particle is preferably 20% or more. When the recovery rate is less than 20%, a resin particle deformed on compressing the obtained conductive particles does not return to original size and therefore a defective connection may occur. The recovery rate is more preferably 40% or more. Here, the recovery rate refers to a recovery rate after putting a load of 9.8 mN on the particle.

The copper layer is a layer having the function of securing conductivity in making a conductive connection using the conductive particle of the present invention. Here, the copper layer may contain a trace of metal other than copper. Further, the copper layer may be formed directly on the resin particle, or a metal layer such as a nickel layer may be interposed between the copper layer and the resin particle.

In the copper layer, an upper limit of an area ratio of an area corresponding to voids in a cross-section in a thickness direction is 5%. The voids in the copper layer are generated due to a chemical reaction during plating, and if the voids exist, the initial connection resistance of the copper layer may become high. However, in the conductive particle of the present invention, since an area ratio of an area corresponding to the void in the cross-section is 5% or less, the copper layer having low initial connection resistance can be formed. When the area ratio is more than 5%, the initial connection resistance of the copper layer may increase. A preferred upper limit of the area ratio is 4.5%, a more preferred upper limit is 2.1%, and a particularly preferred upper limit is 1.6%.

Here, the cross-section in a thickness direction refers to a cross-section of the copper layer in cutting the conductive particle of the present invention in a thickness direction of the copper layer.

A method of measuring an area ratio of an area corresponding to voids in a cross-section in a thickness direction of the copper layer is not particularly limited, and for example, it can be measured by a method in which a specimen of a cross-section of a conductive particle is prepared by cutting the conductive particle fixed in a resin using a microtome or a focused ion beam, and then electron micrographs of the cross-section of the copper layer are taken using a field emission scanning electron microscope (FE-SEM), and from the obtained images, a predetermined area in the cross-section and an area corresponding to voids in the cross-section are determined to calculate a ratio of the area.

Specifically, electron micrographs of the cross-section in a thickness direction of the copper layer are taken using a scanning electron microscope, and an area of the copper layer in the taken electron micrograph is measured. Next, an area of voids existing in the copper layer in the electron micrograph is measured, and an area ratio of an area corresponding to voids to the area of the copper layer is determined by dividing the area of voids by the area of the copper layer. Further, the area of the voids may be measured with a void portion enlarged, or an area of a circle or a box as an approximate shape of the void portion may be measured.

A lower limit of the average crystallite diameter of the copper composing the copper layer is 40 nm. When the average crystallite diameter is less than 40 nm, since the grain boundary increases and oxygen to cause the oxidation of the copper layer is transferred into the copper layer, the copper layer becomes apt to be oxidized and the connection resistance becomes apt to increase when stored for a long period. A preferred lower limit of the average crystallite diameter of the copper is 40.5 nm, a more preferred lower limit is 41 nm, and a particularly preferred lower limit is 41.5 nm. A preferred upper limit of the average crystallite diameter of the copper is 80 nm. When the average crystallite diameter of the copper is more than 80 nm, the ductility of the copper layer may be deteriorated. A more preferred upper limit of the average crystallite diameter of the copper is 60 nm, and a further preferred upper limit is 50 nm.

Here, the average crystallite diameter can be determined by calculating a half-width obtained by eliminating an equipment-dependent value from a peak of a (111) plane of a copper crystal measured by X-ray diffraction and using a Scherrer equation. An apparatus to measure the average crystallite diameter is not particularly limited, and examples of the apparatus include X-ray diffractometer ("RINT 1000" manufactured by Rigaku Corp.) and the like.

A preferred lower limit of the thickness of the copper layer is 0.05 µm and a preferred upper limit is 25 µm. When the thickness of the copper layer is less than 0.05 µm, it may be impossible to exert adequate conductivity. When the thickness of the copper layer is more than 25 µm, aggregation tends to take place in forming the copper layer and the aggregated conductive particles may cause a short circuit between electrodes adjacent to each other. A more preferred lower limit of the thickness of the copper layer is 0.1 µm and a more preferred upper limit is 10 µm.

It is preferable that the conductive particle of the present invention further has a conductive layer on the surface of the copper layer. Examples of the conductive layer include a low melting point metal layer, a gold layer, a palladium layer and the like.

The low melting point metal layer has the function of melting by a reflow step to bond to an electrode and realizing high electrical continuity through surface-contact.

When the low melting point metal layer is formed on the surface of the conductive particle provided with the copper layer, generally, the step of acid-cleaning the surface of the copper layer is performed. Among other things, the acid-cleaning step has been essential after stored for a long period since formation of the copper layer. In the conductive particle of the present invention, since the copper layer formed on the surface is hard to being oxidized, the low melting point metal layer having a uniform thickness can be easily formed on the surface of the copper layer without performing the acid-cleaning step.

A low melting point metal composing the low melting point metal layer is not particularly limited, and publicly known metals, such as tin, tin-copper alloy, tin-silver alloy, tin-bismuth alloy, tin-zinc alloy and the like, can be used.

Among these metals, the tin-silver alloy is suitable because it had good wettability to an electrode and high strength of a joining portion.

Furthermore, for the purpose of improving strength of a joining portion between the low melting point metal layer and the electrode, the low melting point metal layer can contain metals such as nickel, antimony, aluminum, iron, gold, titanium, phosphorus, germanium, tellurium, gallium, cobalt, manganese, chromium, molybdenum, palladium, indium and the like. Among these metals, the low melting point metal layer suitably contains nickel, antimony, or aluminum since these metals have an excellent effect of improving the strength of the joining portion between the low melting point metal layer and the electrode.

The content of the above-mentioned metal in the low melting point metal layer is not particularly limited, but a preferred lower limit of the content of the metal is 0.0001% by weight and a preferred upper limit is 2% by weight. When the content of the metal is less than 0.0001% by weight, the strength of the joining portion between the low melting point metal layer and the electrode may not be adequately improved. When the content of the metal is more than 2% by weight, flexibility of the conductive particle may be impaired.

A preferred lower limit of the thickness of the low melting point metal layer is 0.05 µm and a preferred upper limit is 50 µm. When the thickness of the low melting point metal layer is less than 0.05 µm, there may be cases where the low melting point metal layer cannot adequately bond to an electrode even if being melted by reflowing. When the thickness is more than 50 µm, aggregation tends to take place in forming the low melting point metal layer and the aggregated conductive particles may cause a short circuit between electrodes adjacent to each other. A more preferred lower limit of the thickness of the low melting point metal layer is 0.1 µm and a more preferred upper limit is 40 µm.

A method for forming the low melting point metal layer is not particularly limited, and examples of the method include publicly known methods such as an electroplating method, an electroless plating method and the like.

The low melting point metal layer may be formed directly on the copper layer, but a barrier layer may be interposed between the low melting point metal layer and the copper layer.

The barrier layer has the function of preventing metals such as copper, tin and the like from being mutually diffused between the copper layer and the low melting point metal layer containing a low melting point metal such as tin. Examples of the metals composing the barrier layer include metals such as nickel, zinc, and palladium, but nickel is preferably used since the barrier layer can be easily formed using the nickel.

A preferred lower limit of the thickness of the barrier layer is 0.02 µm and a preferred upper limit is 2 µm. When the thickness of the barrier layer is less than 0.02 µm, it may be impossible to adequately prevent mutual diffusion. When the thickness is more than 2 µm, aggregation tends to take place in forming the barrier layer and the aggregated conductive particles may cause a short circuit between electrodes adjacent to each other. Furthermore, flexibility of the conductive particle to be obtained may be impaired. A more preferred lower limit of the thickness of the barrier layer is 0.05 µm and a more preferred upper limit is 1 µm.

A method for producing a conductive particle of the present invention is not particularly limited as long as it can achieve the area ratio of an area corresponding to voids in the cross-section and the average crystallite diameter, but if a conventional electroless plating method is used, the voids resulting from the main reaction and the side reaction in plating are generated, and it is impossible to achieve both of the area ratio of an area corresponding to voids in the cross-section and the average crystallite diameter.

As a means for removing the voids, for example, known is a method of performing annealing (firing) after a plating treatment. However, it was difficult to remove the voids to a desired level by only annealing. Further, there is a problem that oxidization of the copper layer occurs with the annealing, resulting in the reduction in reliability of the conductive connection.

Further, it is known as a plating technology of a printed-circuit board that if a stabilizer is added to a plating bath, a side reaction is inhibited and copper particles produced with the side reaction are not taken into the plating, and therefore the formation of the voids resulting from the side reaction can be suppressed.

However, in the case of plating the resin particle, since the reaction is performed in such a condition that a reaction surface area is large and reactivity in a plating bath is significantly high, it was difficult to suppress the occurrence of the side reaction to a desired level by only adding the stabilizer for inhibiting the side reaction, as with the step of plating the printed-circuit board. Further, minute projections and depressions to increase the reaction surface area are formed on the surface of the resin particle which serves as a starting point of the plating reaction.

The present inventors made earnest investigations and consequently found that by maintaining the content of the stabilizer in the plating solution where a plating reaction is proceeding at 250 to 550 ppm in the step of electroless plating, formation of voids resulting from the main reaction and the side reaction can be effectively suppressed, and the conductive particle, which achieves the area ratio of an area corresponding to voids in the cross-section and the average crystallite diameter can be obtained.

The method for producing a conductive particle of the present invention is a method for producing a conductive particle, comprising a step of electroless plating in which a copper layer is formed on a surface of a resin particle by an electroless plating method, wherein in the step of electroless plating, a content of a stabilizer is maintained at 250 to 550 ppm in a plating solution where a plating reaction is proceeding.

In addition, in the present invention, the plating solution refers to a solution containing the above resin particles and a copper plating solution.

In the method for producing a conductive particle by the electroless plating method of the present invention, generally, after performing the steps of etching and imparting catalysis, the step of electroless plating is performed.

The step of etching is a step in which for facilitating the adhesion of a plated layer to the resin particle, minute projections and depressions are formed on the surface of the resin particle by using an oxidizer such as chromic acid, mixed acid of sulfuric acid/chromic acid, permanganic acid solution or the like, a strong acid such as hydrochloric acid, sulfuric acid or the like, an strong alkaline solution such as sodium hydroxide, potassium hydroxide or the like, or other commercially available various etching agents.

Further, the step of imparting catalysis is a step of providing a catalyst, which can serve as a starting point of electroless plating of a subsequent step, to the surface of the resin particle In the method for producing a conductive particle of the present invention, in the step of electroless plating, the content of the stabilizer is maintained at 250 to 550 ppm in the plating solution where a plating reaction is proceeding.

The electroless plating step is a step in which the resin particle provided with a catalyst is reacted with the copper plating solution in the presence of a reducing agent to deposit copper plating on the surface of the resin particle taking the provided catalyst as the starting point. Examples of the method of reacting the resin particle provided with a catalyst with the copper plating solution in the presence of a reducing agent include a method 1 in which the copper plating solution is added to the resin particle suspension formed by dispersing the resin particle provided with a catalyst in water or the like, a method 2 in which the suspension of the resin particle provided with a catalyst is added to the copper plating solution, and a method 3 in which the dried powder of the resin particle provided with a catalyst is added to the copper plating solution. Here, only the resin particle suspension may contain the stabilizer, only the copper plating solution may contain the stabilizer, or both of the resin particle suspension and the copper plating solution may contain the stabilizer.

A lower limit of the content of the stabilizer in the plating solution in the electroless plating step is 250 ppm and an upper limit is 550 ppm. When the content of the stabilizer is less than 250 ppm, a sufficient effect of suppressing the voids is not achieved, and the average crystallite diameter becomes small. When the content of the stabilizer is more than 550 ppm, a main reaction in forming plating is suppressed. A preferred lower limit of the content of the stabilizer is 300 ppm and a more preferred lower limit is 400 ppm.

Here, if the copper layer, in which the area ratio of an area corresponding to voids in the cross-section is 5% or less and the copper composing the copper layer has an average crystallite diameter of 40 nm or more, is obtained, the content of the stabilizer in the plating solution does not have to be maintained always at 250 to 550 ppm. However, it is preferable to maintain always the content of the stabilizer in the plating solution at 250 to 550 ppm in order to obtain the conductive particle which has low initial connection resistance and which is hard to increase in connection resistance even when stored for a long period.

When the method of reacting the resin particle provided with a catalyst with the copper plating solution in the presence of a reducing agent is the above-mentioned method 1, since the copper plating solution is added to the resin particle suspension, the concentration of the stabilizer in the plating solution sometimes varies. Therefore, the content of the stabilizer in the resin particle suspension or in the copper plating solution may be appropriately adjusted in advance in such a way that the content of the stabilizer in the plating solution is 250 to 550 ppm during a duration between initiation and completion of addition of the copper plating solution.

In the case of the above-mentioned method 2, since the resin particle suspension is added to the copper plating solution, the concentration of the stabilizer in the plating solution sometimes varies. Therefore, the content of the stabilizer in the resin particle suspension or in the copper plating solution may be appropriately adjusted in advance in such a way that the content of the stabilizer in the plating solution is 250 to 550 ppm during a duration between initiation and completion of addition of the resin particle suspension.

In the case of the above-mentioned method 3, since the dried powder of the resin particle provided with a catalyst is added to the copper plating solution, the content of the stabilizer in the copper plating solution may be adjusted.

Among these methods, the method 1 or the method 2 is preferably employed since its plating reaction rate can be adjusted.

The stabilizer is not particularly limited, and examples of the stabilizer include cyan compounds, organic compounds having a nitrogen atom, sulfur compounds, and the like, and examples thereof include 2,2'-bipyridyl, sodium diethyldithiocarbamate, potassium thiocyanate, 2,2'-dipyridine, nicotinic acid, thiourea, tetramethylthiourea, cupron, cupferron, thiazole, 2-mercaptobenzothiazole, potassium ferrocyanide, potassium ferricyanide, sodium cyanide, pyrrole, pyrazole, imidazole, 1,2,4-triazole, 1,2,4-benzotriazole, thiophene, thiomerid, rhodanine, rubeanic acid, pyridine, triazine, methyl orange, benzoquinoline, 2,2'-biquinoline, dithizone, diphenylcarbazide, neocuproine, 2-(2-pyridyl)-2-imidazoline, and 1,10-phenanthroline. Among these compounds, 2,2'-bipyridyl is preferably employed because a copper layer which is superior in ductility and conductivity can be obtained by use of this. These stabilizers may be used alone or in combination of two or more species.

The conductive particle, which achieves the area ratio of an area corresponding to voids in the cross-section and the average crystallite diameter specified in the present invention, can be obtained by maintaining the content of the stabilizer in the plating solution where a plating reaction is proceeding at 100 to 550 ppm in the step of electroless plating, and further annealing the obtained conductive particle. As described above, it is difficult to adequately remove the voids to a desired level by only annealing. Also, it is difficult to remove the voids even by annealing for a long time. However, by combining a plating method using the stabilizer with the annealing, it is possible to achieve the area ratio of an area corresponding to voids in the cross-section and the average crystallite diameter specified in the present invention.

A method of producing a conductive particle, comprising a step of electroless plating in which a copper layer is formed on a surface of a resin particle by an electroless plating method and step of annealing the resin particle on which the copper layer is formed by the electroless plating method, wherein in the step of electroless plating, a content of a stabilizer is maintained at 100 to 550 ppm in a plating solution where a plating reaction is proceeding also constitutes the present invention.

In the step of annealing, it is preferable to anneal the resin particle, on which the copper layer is formed, in a substantially vacuum environment since oxidation of the copper layer can be suppressed in this environment. A state in a vacuum environment is preferably a state in an environment of a pressure of 0.1 MPa or lower.

A time where annealing is performed is not particularly limited, but the time is preferably 1 to 10 hours, and more preferably 5 to 10 hours.

A temperature where annealing is performed is not particularly limited, but the temperature is preferably 150° C. or more, and more preferably 150 to 200° C.

The conductive particles of the present invention can be suitably used as an anisotropic conductive material by dispersing the conductive particles of the present invention in an insulative binder resin. For example, by mixing and kneading the conductive particles of the present invention with a binder resin or an adhesive, the conductive particles can be used as the anisotropic conductive materials such as anisotropic conductive paste, anisotropic conductive ink, an anisotropic conductive adhesive, an anisotropic conductive film and an anisotropic conductive sheet. An anisotropic conductive material containing the conductive particles of the present invention also constitutes the present invention.

Moreover, in accordance with the conductive particle of the present invention, a connection structure, which can exert high connection stability in using particularly in narrow conductive connection between electrodes formed in a circuit board or an electronic, can be obtained. A connection structure which is in conductive connection by using the conductive particle or the anisotropic conductive material of the present invention, also constitutes the present invention.

EFFECT OF THE INVENTION

In accordance with the present invention, it is possible to provide a conductive particle which has low initial connection resistance and which is hard to increase in connection resistance even when stored for a long period. Also, it is possible to provide a method of producing the conductive particle.

BEST MODE FOR CARRYING OUT THE INVENTION

Hereinafter, aspects of the present invention will be described in more detail by way of examples, but the present invention is not limited to these examples.

EXAMPLE 1

Resin particles (average particle diameter 80 μm) made of a copolymer of 50% by weight of tetramethylol methane tetraacrylate and 50% by weight of divinylbenzene were etched and then washed with water. Next, the resin particles were treated for 5 minutes with a 10% by weight solution of an ion adsorbent and then treated for 5 minutes with a 0.01% by weight aqueous solution of palladium sulfate, and dimethylamine-borane was further added thereto to reduce the resultant mixture. Subsequently, filtration and washing were performed to obtain resin particles provided with palladium.

2 g of the obtained resin particles were added to 50 mL of water, and to the resulting mixture, 2,2'-bipyridyl was added to prepare a particle suspension in which the concentration of 2,2'-bipyridyl was 550 ppm.

450 mL of the following copper plating solution (pH 12, plating solution temperature 65° C.) was gradually added to the particle suspension while stirring the resulting particle suspension to initiate a plating reaction. Here, the plating reaction was allowed to proceed while adjusting the plating solution in such a way that the concentration of 2,2'-bipyridyl in the plating solution was 550 ppm.

Composition of Copper Plating Solution
Copper sulfate pentahydrate: 21 g/L
Formaldehyde (37% by weight aqueous solution): 60 g/L
Ethylenediaminetetraacetic acid: 45 g/L
2,2'-bipyridyl: 550 ppm
Polyethylene glycol (molecular weight 1000): 50 ppm After the reaction, filtration and washing of the particle suspension were carried out, and the resulting particles were vacuum-dried at 100° C. for 60 minutes, and thereby conductive particles, where a copper layer of 3 μm in thickness was formed on the surface of the resin particle, were obtained.

EXAMPLE 2

Conductive particles were prepared in the same manner as in Example 1 except that the concentration of 2,2'-bipyridyl in a particle suspension was 500 ppm and that the composition of a copper plating solution was as follows. Here, a plating reaction was allowed to proceed while adjusting the plating solution in such a way that the concentration of 2,2'-bipyridyl in the plating solution was 500 ppm.

Composition of Copper Plating Solution
Copper sulfate pentahydrate: 21 g/L
Formaldehyde (37% by weight aqueous solution): 60 g/L
Ethylenediaminetetraacetic acid: 45 g/L
2,2'-bipyridyl: 500 ppm
Polyethylene glycol (molecular weight 1000): 50 ppm

EXAMPLE 3

Conductive particles were prepared in the same manner as in Example 1 except that the concentration of 2,2'-bipyridyl in a particle suspension was 400 ppm and that the composition of a copper plating solution was as follows. Here, a plating reaction was allowed to proceed while adjusting the plating solution in such a way that the concentration of 2,2'-bipyridyl in the plating solution was 400 ppm.

Composition of Copper Plating Solution
Copper sulfate pentahydrate: 21 g/L
Formaldehyde (37% by weight aqueous solution): 60 g/L
Ethylenediaminetetraacetic acid: 45 g/L
2,2'-bipyridyl: 400 ppm
Polyethylene glycol (molecular weight 1000): 50 ppm

EXAMPLE 4

Conductive particles were prepared in the same manner as in Example 1 except that the concentration of 2,2'-bipyridyl in a particle suspension was 300 ppm and that the composition of a copper plating solution was as follows. Here, a plating reaction was allowed to proceed while adjusting the plating solution in such a way that the concentration of 2,2'-bipyridyl in the plating solution was 300 ppm.

Composition of Copper Plating Solution
    Copper sulfate pentahydrate: 21 g/L
    Formaldehyde (37% by weight aqueous solution): 60 g/L
    Ethylenediaminetetraacetic acid: 45 g/L
    2,2'-bipyridyl: 300 ppm
    Polyethylene glycol (molecular weight 1000): 50 ppm

EXAMPLE 5

Conductive particles were prepared in the same manner as in Example 1 except that the concentration of 2,2'-bipyridyl in a particle suspension was 250 ppm and that the composition of a copper plating solution was as follows. Here, a plating reaction was allowed to proceed while adjusting the plating solution in such a way that the concentration of 2,2'-bipyridyl in the plating solution was 250 ppm.
Composition of Copper Plating Solution
    Copper sulfate pentahydrate: 21 g/L
    Formaldehyde (37% by weight aqueous solution): 60 g/L
    Ethylenediaminetetraacetic acid: 45 g/L
    2,2'-bipyridyl: 250 ppm
    Polyethylene glycol (molecular weight 1000): 50 ppm

EXAMPLE 6

The conductive particles obtained in Example 1 were further annealed at 150° C. for 300 minutes in a vacuum to obtain conductive particles. Here, the term "in a vacuum" hereinafter means "in an environment of a pressure of 0.1 MPa or lower".

EXAMPLE 7

The conductive particles obtained in Example 2 were further annealed at 150° C. for 300 minutes in a vacuum to obtain conductive particles.

EXAMPLE 8

The conductive particles obtained in Example 3 were further annealed at 150° C. for 300 minutes in a vacuum to obtain conductive particles.

EXAMPLE 9

The conductive particles obtained in Example 4 were further annealed at 150° C. for 300 minutes in a vacuum to obtain conductive particles.

EXAMPLE 10

The conductive particles obtained in Example 5 were further annealed at 150° C. for 300 minutes in a vacuum to obtain conductive particles.

COMPARATIVE EXAMPLE 1

Conductive particles were prepared in the same manner as in Example 1 except that the concentration of 2,2'-bipyridyl in a particle suspension was 200 ppm and that the composition of a copper plating solution was as follows. Here, a plating reaction was allowed to proceed while adjusting the plating solution in such a way that the concentration of 2,2'-bipyridyl in the plating solution was 200 ppm.
Composition of Copper Plating Solution
    Copper sulfate pentahydrate: 21 g/L
    Formaldehyde (37% by weight aqueous solution): 60 g/L
    Ethylenediaminetetraacetic acid: 45 g/L
    2,2'-bipyridyl: 200 ppm
    Polyethylene glycol (molecular weight 1000): 50 ppm

COMPARATIVE EXAMPLE 2

Conductive particles were prepared in the same manner as in Example 1 except that the concentration of 2,2'-bipyridyl in a particle suspension was 100 ppm and that the composition of a copper plating solution was as follows. Here, a plating reaction was allowed to proceed while adjusting the plating solution in such a way that the concentration of 2,2'-bipyridyl in the plating solution was 100 ppm.
Composition of Copper Plating Solution
    Copper sulfate pentahydrate: 21 g/L
    Formaldehyde (37% by weight aqueous solution): 60 g/L
    Ethylenediaminetetraacetic acid: 45 g/L
    2,2'-bipyridyl: 100 ppm
    Polyethylene glycol (molecular weight 1000): 50 ppm

COMPARATIVE EXAMPLE 3

Conductive particles were prepared in the same manner as in Example 1 except that the concentration of 2,2'-bipyridyl in a particle suspension was 50 ppm and that the composition of a copper plating solution was as follows. Here, a plating reaction was allowed to proceed while adjusting the plating solution in such a way that the concentration of 2,2'-bipyridyl in the plating solution was 50 ppm.
Composition of Copper Plating Solution
    Copper sulfate pentahydrate: 21 g/L
    Formaldehyde (37% by weight aqueous solution): 60 g/L
    Ethylenediaminetetraacetic acid: 45 g/L
    2,2'-bipyridyl: 50 ppm
    Polyethylene glycol (molecular weight 1000): 50 ppm

COMPARATIVE EXAMPLE 4

The conductive particles obtained in Comparative Example 3 were further annealed at 150° C. for 300 minutes in a vacuum to obtain conductive particles.

COMPARATIVE EXAMPLE 5

Conductive particles were prepared in the same manner as in Example 1 except that the concentration of 2,2'-bipyridyl in a particle suspension was 600 ppm and that the composition of a copper plating solution was as follows. Here, a plating reaction was allowed to proceed while adjusting the plating solution in such a way that the concentration of 2,2'-bipyridyl in the plating solution was 600 ppm.
Composition of Copper Plating Solution
    Copper sulfate pentahydrate: 21 g/L
    Formaldehyde (37% by weight aqueous solution): 60 g/L
    Ethylenediaminetetraacetic acid: 45 g/L 2,2'-bipyridyl: 600 ppm
    Polyethylene glycol (molecular weight 1000): 50 ppm

EXAMPLE 11

The conductive particles obtained in Comparative Example 1 were further annealed at 150° C. for 300 minutes in a vacuum to obtain conductive particles.

EXAMPLE 12

The conductive particles obtained in Comparative Example 2 were further annealed at 150° C. for 300 minutes in a vacuum to obtain conductive particles.

(Evaluation)

The obtained conductive particles were evaluated according to the following methods.

The evaluation results are shown in Table 1.

(1) Measurement of Area Ratio of Void

Ten electron micrographs of a cross-section in a thickness direction of the copper layer of the obtained conductive particle were taken using a scanning electron microscope (FE-SEM) (manufactured by HORIBA, Ltd.). Next, a whole area of the cross-section in a thickness direction of the copper layer was measured, and then an area of voids in the cross-section in a thickness direction of the copper layer in the electron micrograph was measured. Thereafter, an area ratio of the void to the area of the copper layer in each electron micrograph was determined by dividing the area of voids by the whole area of the cross-section in a thickness direction of the copper layer. Thereafter, an average of the area ratios of the voids was calculated to determine an area ratio of the void. Here, the electron micrographs were taken in such a way that the whole area of the cross-section in a thickness direction of the copper layer in one electron micrograph was at least 40 μm².

Figure 1:
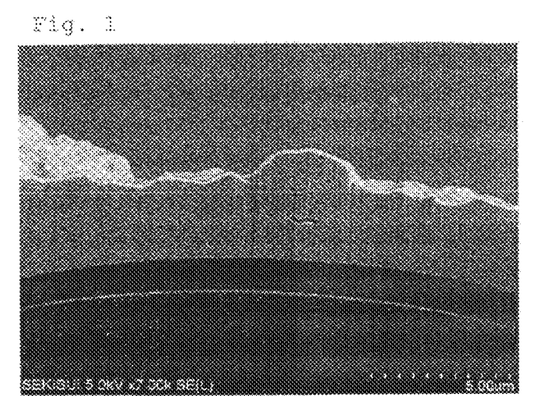
FIG. 1 is an electron micrograph of a cross-section of the copper layer of the conductive particle obtained in Example 2.
Figure 2:
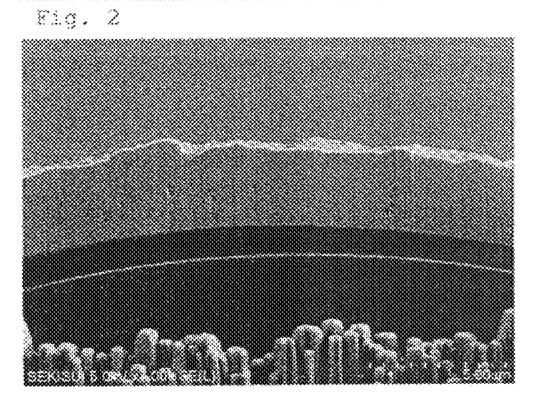
FIG. 2 is an electron micrograph of a cross-section of the copper layer of the conductive particle obtained in Example 5.
Figure 3:
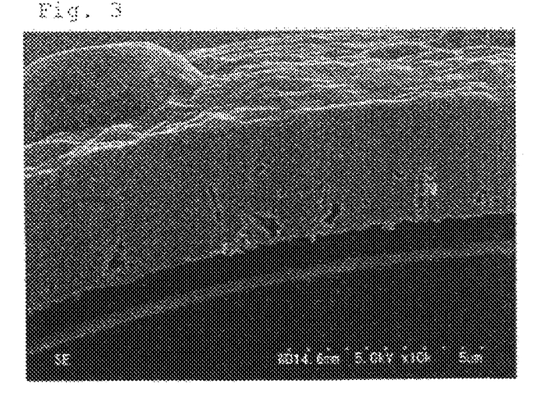
FIG. 3 is an electron micrograph of a cross-section of the copper layer of the conductive particle obtained in Comparative Example 3.
Figure 4:
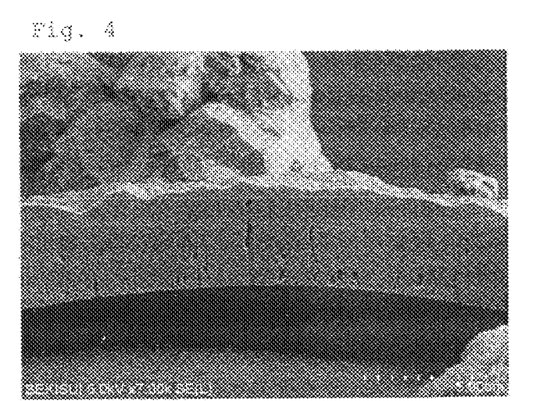
FIG. 4 is an electron micrograph of a cross-section of the copper layer of the conductive particle obtained in Comparative Example 4.
Figure 5:
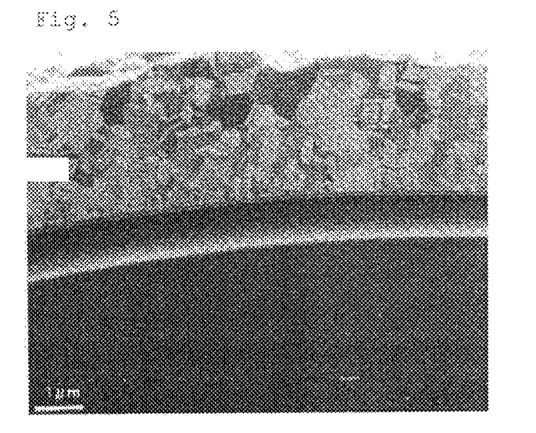
FIG. 5 is an electron micrograph showing a crystal state of the copper layer of the conductive particle obtained in Example 2.
Figure 6:
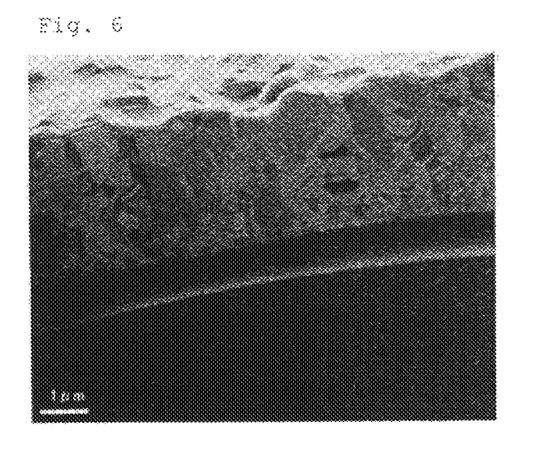
FIG. 6 is an electron micrograph showing a crystal state of the copper layer of the conductive particle obtained in Example 5.
Figure 7:
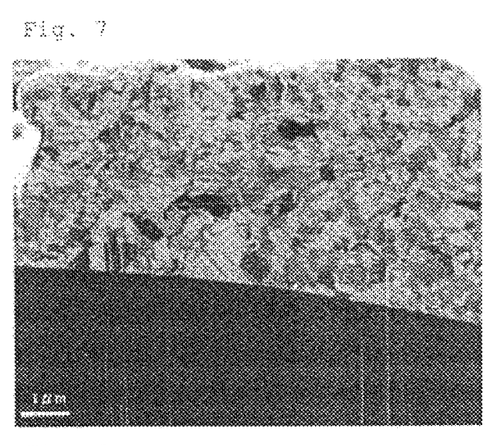
FIG. 7 is an electron micrograph showing a crystal state of the copper layer of the conductive-particle obtained in Comparative Example 3.
Figure 8:
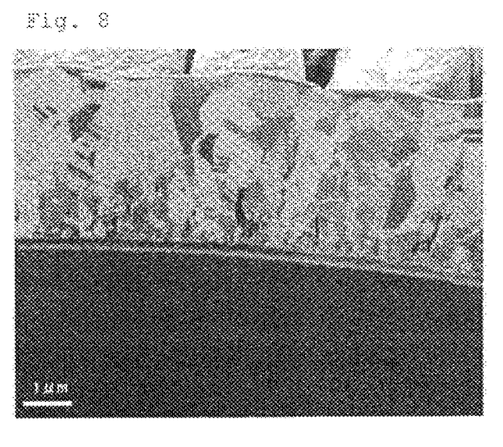
FIG. 8 is an electron micrograph showing a crystal state of the copper layer of the conductive particle obtained in Comparative Example 4.

Here, the electron micrographs of the cross-sections of the copper layers of the conductive particles of Examples 2, 5 and Comparative Examples 3, 4 are shown in FIGS. 1 to 4. The electron micrographs showing crystal states of the copper layers of Examples 2, 5 and Comparative Examples 3, 4 are shown in FIGS. 5 to 8.

(2) Measurement of Average Crystallite Diameter

The average crystallite diameter was determined by calculating a half-width obtained by eliminating an equipment-dependent value from a peak of a (111) plane of a copper crystal measured by X-ray diffraction of the obtained conductive particle and using the following Scherrer equation. Here, the average crystallite diameter was measured by using an X-ray diffractometer ("RINT 1000" manufactured by Rigaku Corp.).

$$D = K\lambda/\beta \cos \theta$$

D: crystallite diameter

λ: wavelength of a measuring X-ray

β (rad): expansion of a diffraction ray depending on a size of a crystallite (half-width)

θ (rad): angle of a peak measured

K: Scherrer constant (3) Measurement of Initial Conductivity and Conductivity After Change Over Time The obtained conductive particles were cleaned for 5 minutes in a 10% by weight sulfuric acid by ultrasonic cleaning, and then cleaned for 1 minute in pure water by ultrasonic cleaning. Next, the conductive particles were washed with ethanol to obtain acid-cleaned conductive particles.

Furthermore, the acid-cleaned conductive particles were left standing for five days in the atmosphere (23° C., 50% in humidity) to obtain conductive particles after change over time.

The conductivities (S/cm) of the conductive particle after acid-cleaning and the conductive particle after change over time were measured. The measurement was carried out at a load of 20 kN in a ring electrode system by four probe analysis using a powder resistance measuring system (Loresta PA System, "MCP-PD51" manufactured by Mitsubishi Chemical Corp.).

TABLE 1

| | Area ratio of void (%) | Average crystallite diameter (nm) | Conductivity (S/cm) After acid-cleaning | Conductivity (S/cm) After change over time |
|---|---|---|---|---|
| Example 1 | 1.10 | 43.6 | $2.125 \times 10^4$ | $1.985 \times 10^4$ |
| Example 2 | 1.17 | 41.8 | $2.060 \times 10^4$ | $1.912 \times 10^4$ |
| Example 3 | 1.42 | 41.2 | $2.001 \times 10^4$ | $1.879 \times 10^4$ |
| Example 4 | 1.60 | 40.6 | $1.980 \times 10^4$ | $1.503 \times 10^4$ |
| Example 5 | 1.95 | 40.3 | $1.977 \times 10^4$ | $1.148 \times 10^4$ |
| Example 6 | 0.83 | 49.7 | $2.210 \times 10^4$ | $2.090 \times 10^4$ |
| Example 7 | 0.89 | 48.2 | $2.140 \times 10^4$ | $2.015 \times 10^4$ |
| Example 8 | 0.97 | 47.6 | $2.139 \times 10^4$ | $1.990 \times 10^4$ |
| Example 9 | 1.31 | 47.2 | $2.127 \times 10^4$ | $1.965 \times 10^4$ |
| Example 10 | 1.54 | 46.4 | $2.099 \times 10^4$ | $1.901 \times 10^4$ |
| Example 11 | 2.06 | 45.9 | $2.035 \times 10^4$ | $1.744 \times 10^4$ |
| Example 12 | 4.42 | 44.1 | $1.997 \times 10^4$ | $1.453 \times 10^4$ |
| Comparative Example 1 | 3.12 | 38.0 | $1.959 \times 10^4$ | $8.903 \times 10^3$ |
| Comparative Example 2 | 5.56 | 35.6 | $1.910 \times 10^4$ | $2.618 \times 10^3$ |
| Comparative Example 3 | 7.09 | 34.0 | $1.859 \times 10^4$ | $1.216 \times 10^2$ |
| Comparative Example 4 | 5.21 | 42.8 | $1.885 \times 10^4$ | $9.607 \times 10^3$ |
| Comparative Example 5 | — | | | |

The conductive particles obtained in Examples had large conductivities after acid-cleaning, and maintained the conductivities at 50% or more after change over time. On the other hand, the conductive particles obtained in Comparative Examples had smaller conductivities than those in Examples after acid-cleaning, and the conductivities were significantly deteriorated after change over time. In addition, in Comparative Example 5, a main reaction in forming the plating is inhibited and a copper layer having a sufficient thickness could not be formed.

EXAMPLE 13

By electroplating the conductive particles after change over time obtained in Example 1, a low melting point metal layer of 15 μm in thickness containing tin and silver (tin: silver=96.5% by weight: 3.5% by weight) was formed on the surface of the copper layer of each particle. Then, the electroplating solution was filtrated, and the resulting particles were washed with water, and then vacuum-dried at 50° C. for 60 minutes, and thereby conductive particles where a copper layer and a low melting point metal layer were sequentially formed on the surface of the resin particle were obtained.

EXAMPLE 14

Conductive particles were prepared in the same manner as in Example 13 except that the conductive particles after change over time obtained in Example 1 was changed to the conductive particles after change over time obtained in Example 2.

EXAMPLE 15

Conductive particles were prepared in the same manner as in Example 13 except that the conductive particles after change over time obtained in Example 1 was changed to the conductive particles after change over time obtained in Example 3.

EXAMPLE 16

Conductive particles were prepared in the same manner as in Example 13 except that the conductive particles after change over time obtained in Example 1 was changed to the conductive particles after change over time obtained in Example 4.

EXAMPLE 17

Conductive particles were prepared in the same manner as in Example 13 except that the conductive particles after change over time obtained in Example 1 was changed to the conductive particles after change over time obtained in Example 5.

EXAMPLE 18

Conductive particles were prepared in the same manner as in Example 13 except that the conductive particles after change over time obtained in Example 1 was changed to the conductive particles after change over time obtained in Example 6.

EXAMPLE 19

Conductive particles were prepared in the same manner as in Example 13 except that the conductive particles after change over time obtained in Example 1 was changed to the conductive particles after change over time obtained in Example 7.

EXAMPLE 20

Conductive particles were prepared in the same manner as in Example 13 except that the conductive particles after change over time obtained in Example 1 was changed to the conductive particles after change over time obtained in Example 8.

EXAMPLE 21

Conductive particles were prepared in the same manner as in Example 13 except that the conductive particles after change over time obtained in Example 1 was changed to the conductive particles after change over time obtained in Example 9.

EXAMPLE 22

Conductive particles were prepared in the same manner as in Example 13 except that the conductive particles after change over time obtained in Example 1 was changed to the conductive particles after change over time obtained in Example 10.

EXAMPLE 23

Conductive particles were prepared in the same manner as in Example 13 except that the conductive particles after change over time obtained in Example 1 was changed to the conductive particles after change over time obtained in Example 11.

EXAMPLE 24

Conductive particles were prepared in the same manner as in Example 13 except that the conductive particles after change over time obtained in Example 1 was changed to the conductive particles after change over time obtained in Example 12.

COMPARATIVE EXAMPLE 6

Conductive particles were prepared in the same manner as in Example 6 except that the conductive particles after change over time obtained in Example 1 was changed to the conductive particles after change over time obtained in Comparative Example 1.

COMPARATIVE EXAMPLE 7

Conductive particles were prepared in the same manner as in Example 6 except that the conductive particles after change over time obtained in Example 1 was changed to the conductive particles after change over time obtained in Comparative Example 2.

COMPARATIVE EXAMPLE 8

Conductive particles were prepared in the same manner as in Example 6 except that the conductive particles after change over time obtained in Example 1 was changed to the conductive particles after change over time obtained in Comparative Example 3.

COMPARATIVE EXAMPLE 9

Conductive particles were prepared in the same manner as in Example 6 except that the conductive particles after change over time obtained in Example 1 was changed to the conductive particles after change over time obtained in Comparative Example 4.

(Evaluation)

The obtained conductive particles were evaluated according to the following method.

The evaluation results are shown in Table 2.

(4) Surface Observation of Conductive Particle

Surfaces of 100 conductive particles obtained in Examples 13 to 24 and Comparative Examples 6 to 9 were observed with an optical microscope. The case where there are nine or less conductive particles in which the thickness of the low melting point metal layer is not uniform was rated as a symbol "⊙", the case where there are 10 to 24 conductive particles in which the thickness of the low melting point metal layer is not uniform was rated as a symbol "○", the case where there are 25 to 49 conductive particles in which the thickness of the low melting point metal layer is not uniform was rated as a symbol "Δ", and the case where there are 50 or more conductive particles in which the thickness of the low melting point metal layer is not uniform was rated as a symbol "x".

TABLE 2

| | Low melting point metal layer | Surface observation |
| --- | --- | --- |
| Example 13 | Sn—Ag | ⊙ |
| Example 14 | Sn—Ag | ⊙ |
| Example 15 | Sn—Ag | ○ |
| Example 16 | Sn—Ag | ○ |
| Example 17 | Sn—Ag | ○ |
| Example 18 | Sn—Ag | ⊙ |
| Example 19 | Sn—Ag | ⊙ |
| Example 20 | Sn—Ag | ⊙ |
| Example 21 | Sn—Ag | ⊙ |
| Example 22 | Sn—Ag | ⊙ |
| Example 23 | Sn—Ag | ○ |
| Example 24 | Sn—Ag | ○ |
| Comparative Example 6 | Sn—Ag | Δ |

TABLE 2-continued

| | Low melting point metal layer | Surface observation |
|---|---|---|
| Comparative Example 7 | Sn—Ag | X |
| Comparative Example 8 | Sn—Ag | X |
| Comparative Example 9 | Sn—Ag | Δ |

Industrial Applicability

In accordance with the present invention, it is possible to provide a conductive particle which has low initial connection resistance and which is hard to increase in connection resistance even when stored for a long period. Also, it is possible to provide a method of producing the conductive particle.

The invention claimed is:

1. A conductive particle comprising a layer consisting of copper and a trace metal other than copper formed on a surface of a resin particle,
    wherein in said layer consisting of copper and a trace metal other than copper, an area ratio of an area corresponding to voids in a cross-section in a thickness direction is 5% or less, and copper composing said layer consisting of copper and a trace metal other than copper has an average crystallite diameter of 40 to 80 nm, and
    wherein the conductive particle further comprises a low melting point metal layer on the surface of the layer consisting of copper and a trace metal other than copper.

2. The conductive particle according to claim 1,
    wherein in the layer consisting of copper and a trace metal other than copper, an area ratio of an area corresponding to voids in a cross-section in a thickness direction is 4.5% or less.

3. An anisotropic conductive material,
    which comprises the conductive particle according to claim 1.

4. A connection structure,
    which is in conductive connection by using the conductive particle according to claim 1.

5. A connection structure,
    which is in conductive connection by using the anisotropic conductive material according to claim 3.

* * * * *